US009653174B2

(12) United States Patent
Date

(10) Patent No.: US 9,653,174 B2
(45) Date of Patent: May 16, 2017

(54) SEMICONDUCTOR STORAGE DEVICE

(71) Applicant: KABUSHIKI KAISHA TOSHIBA, Minato-ku (JP)

(72) Inventor: Hiroki Date, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 14/844,342

(22) Filed: Sep. 3, 2015

(65) Prior Publication Data

US 2016/0267997 A1 Sep. 15, 2016

Related U.S. Application Data

(60) Provisional application No. 62/130,864, filed on Mar. 10, 2015.

(51) Int. Cl.

*G11C 16/24* (2006.01)
*G11C 16/32* (2006.01)
*G11C 16/26* (2006.01)
*G11C 16/04* (2006.01)

(52) U.S. Cl.

CPC .......... *G11C 16/24* (2013.01); *G11C 16/0483* (2013.01); *G11C 16/26* (2013.01); *G11C 16/32* (2013.01)

(58) Field of Classification Search

None

See application file for complete search history.

(56) References Cited

U.S. PATENT DOCUMENTS 4,839,860 A * 6/1989 Shinoda .............. G06F 11/1008 365/104
6,473,327 B1 * 10/2002 Ishizuka .............. G11C 17/126 365/103
7,342,826 B2 3/2008 Fujito et al.

FOREIGN PATENT DOCUMENTS

GB 2433340 * 6/2007
JP 2000-339983 A 12/2000

* cited by examiner

*Primary Examiner* — James G Norman

(74) *Attorney, Agent, or Firm* — Oblon, McClelland, Maier & Neustadt, L.L.P.

(57) ABSTRACT

According to one embodiment, a semiconductor storage device includes memory cell array including a memory cell, a bit line coupled to the memory cell, a sense circuit coupled to the bit line and being capable of charging the bit line, and a charging circuit, the memory cell array being disposed between the sense circuit and the charging circuit and being capable of charging the bit line.

13 Claims, 5 Drawing Sheets

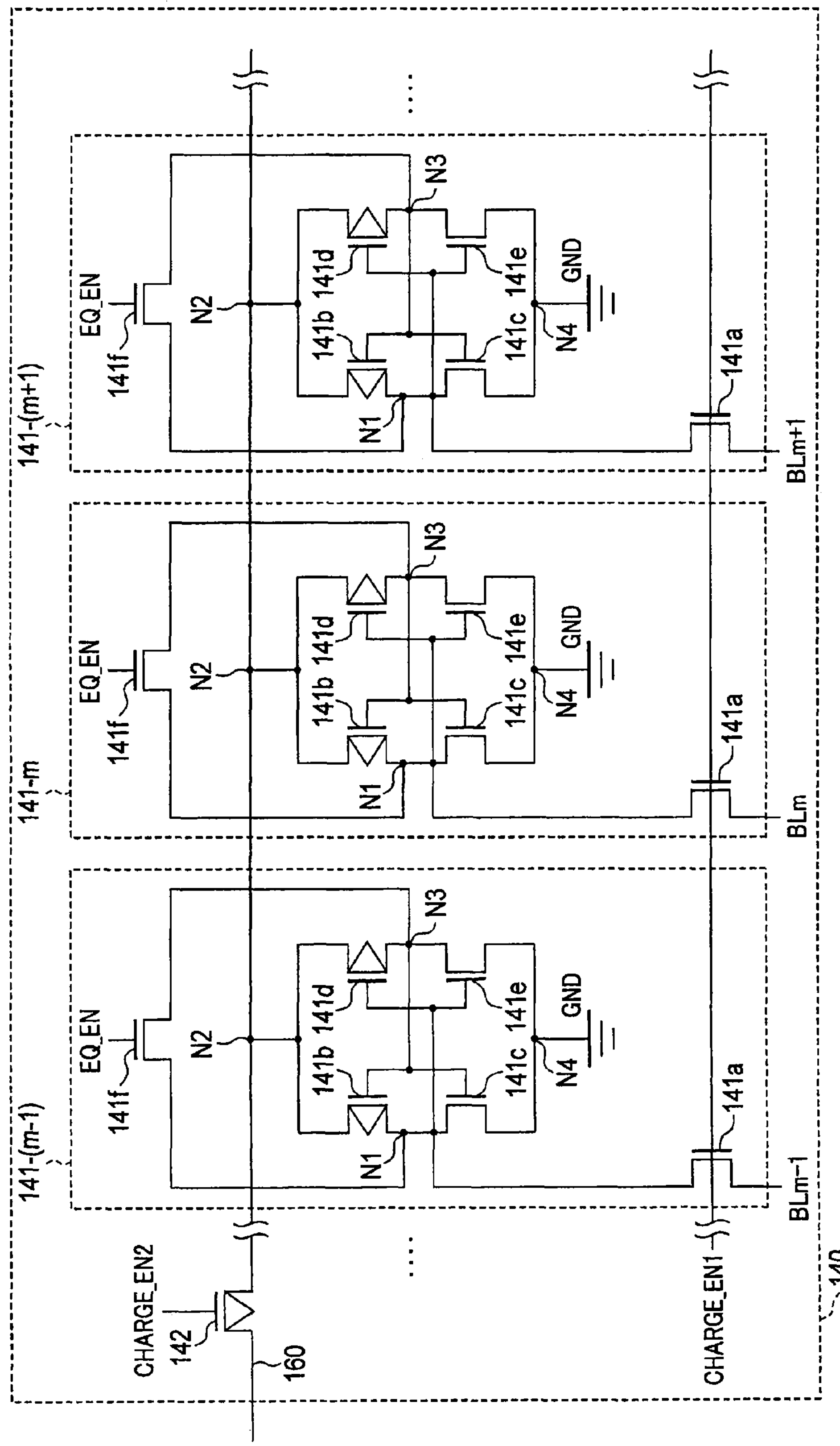
F I G. 2

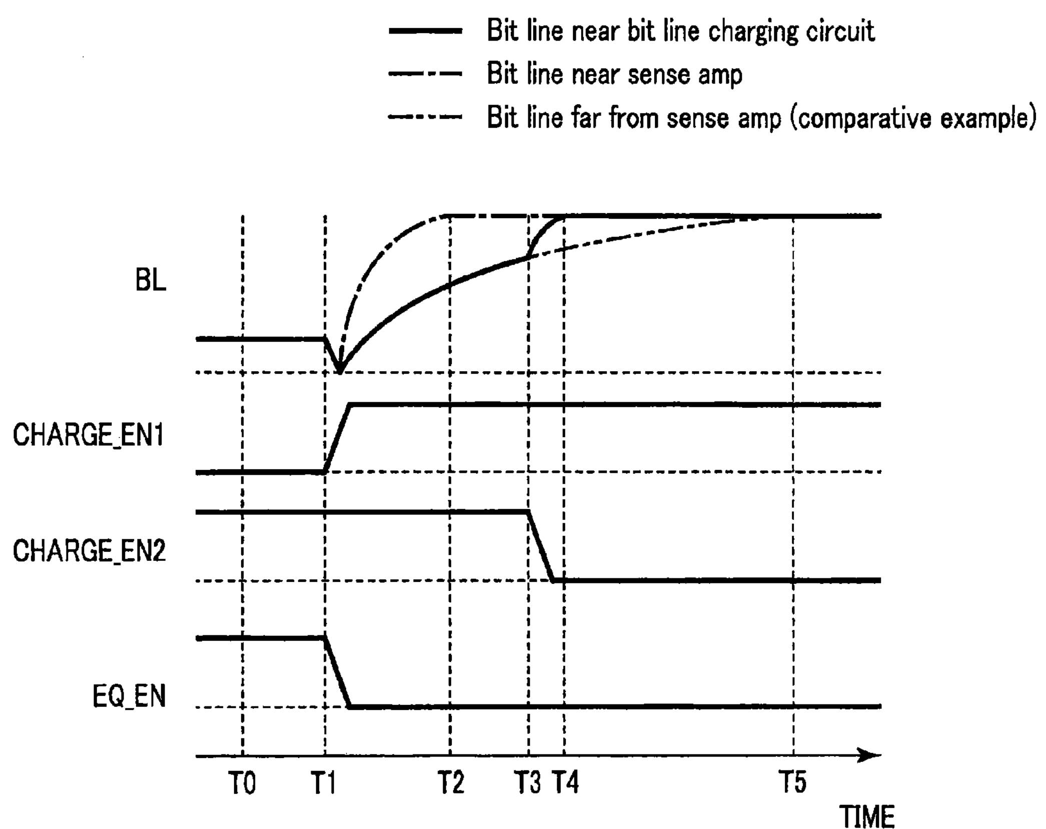
F I G. 3

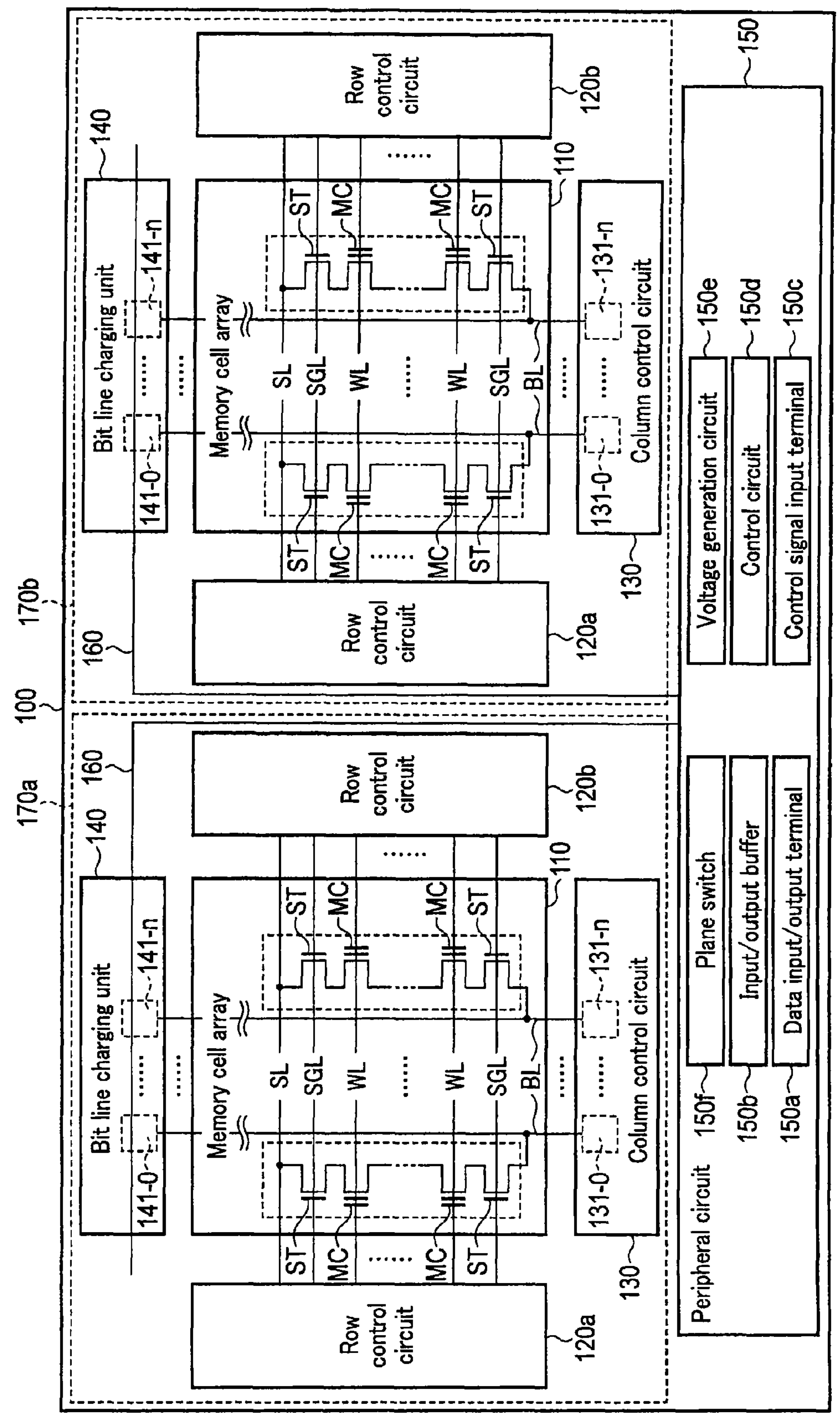
F I G. 5

SEMICONDUCTOR STORAGE DEVICE

CROSS-REFERENCE TO RELATED APPLICATIONS

This application claims the benefit of U.S. Provisional Application No. 62/130,864, filed Mar. 10, 2015, the entire contents of which are incorporated herein by reference.

FIELD

Embodiments described herein relate generally to a memory system.

BACKGROUND

Semiconductor storage devices have become more miniaturized.

BRIEF DESCRIPTION OF THE DRAWINGS

FIG. 2 is a circuit diagram showing the basic arrangement of a bit line charging circuit provided in the NAND flash memory according to the embodiment;

FIG. 3 is a timing chart showing the charging operation of the memory cell array of the NAND flash memory according to the embodiment;

FIG. 5 is a block diagram schematically showing the basic arrangement of a NAND flash memory according to the second modification of the embodiment.

DETAILED DESCRIPTION

Figure 1:
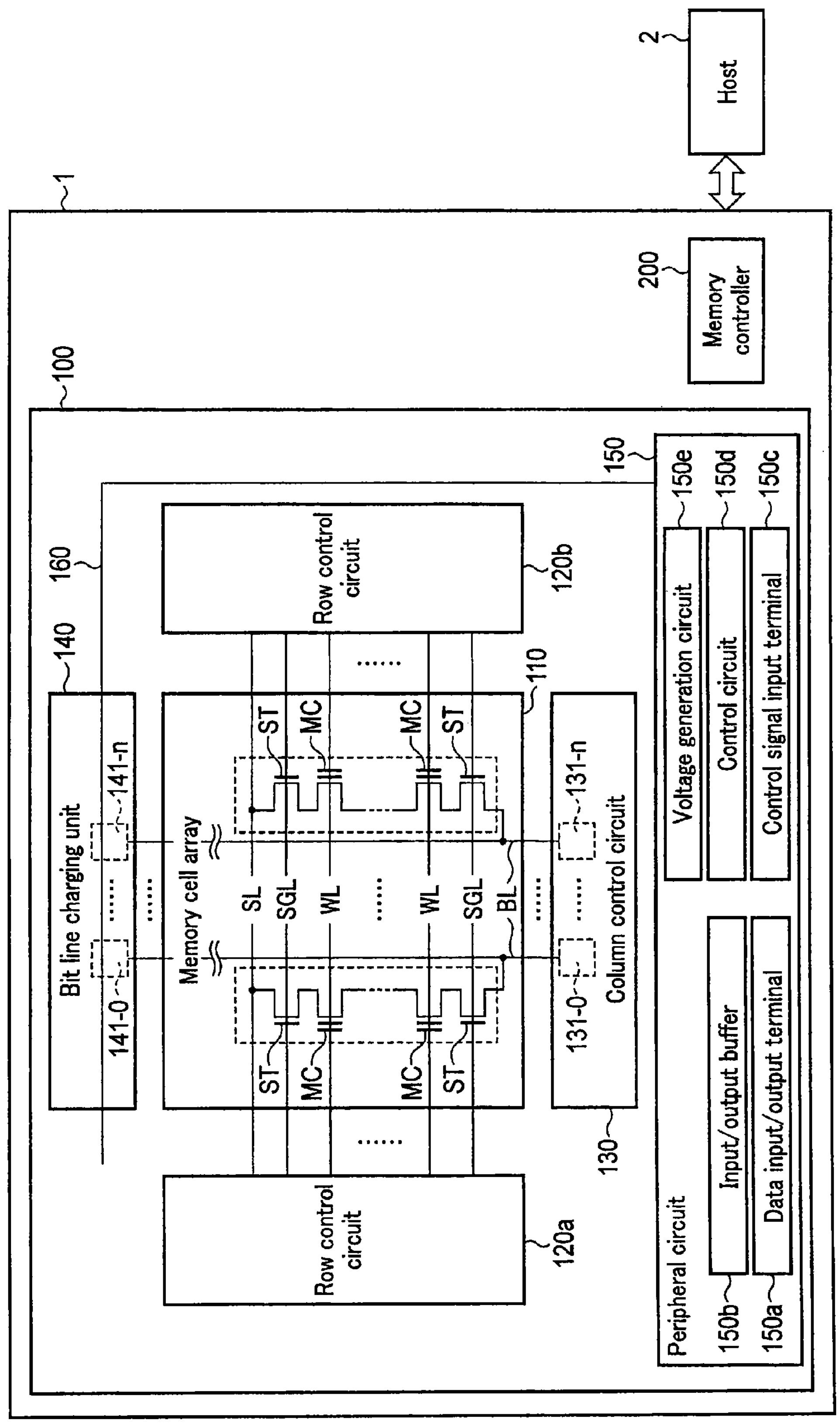
FIG. 1 is a block diagram schematically showing the basic arrangement of a NAND flash memory according to an embodiment.

In general, according to one embodiment, a semiconductor storage device includes memory cell array including a memory cell, a bit line coupled to the memory cell, a sense circuit coupled to the bit line and being capable of charging the bit line, and a charging circuit, the memory cell array being disposed between the sense circuit and the charging circuit and being capable of charging the bit line.

An embodiment will now be described with reference to the accompanying drawings. In the following description, the same reference numerals denote the same parts throughout the drawings.

<1> Embodiment

A semiconductor storage device according to an embodiment will be described. An example in which a planar NAND flash memory is applied as the semiconductor storage device will be explained below.

<1-0> Arrangement of Memory System

The arrangement of a memory system including the semiconductor storage device according to the embodiment will be described first with reference to FIG. 1.

As shown in FIG. 1, a memory system 1 includes a NAND flash memory 100 and a memory controller 200. The memory controller 200 and the NAND flash memory 100 can be, for example, combined to form one semiconductor device. Examples of the semiconductor device are a memory card such as an SD™ card, and an SSD (Solid State Drive). The memory system 1 may further include a host device 2.

<1-1> Overall Arrangement of NAND Flash Memory

The arrangement of the NAND flash memory (semiconductor storage device) 100 according to the embodiment will schematically be explained with reference to FIG. 1.

As shown in FIG. 1, the NAND flash memory 100 includes a memory cell array 110, row control circuits 120*a* and 120*b*, a column control circuit 130, a bit line charging unit 140, a peripheral circuit 150, and a power supply line 160.

The peripheral circuit 150 includes a data input/output terminal 150*a*, an input/output buffer 150*b*, a control signal input terminal 150*c*, a control circuit 150*d*, and a voltage generation circuit 150*e*.

The memory cell array 110 includes a plurality of bit lines BL, a plurality of word lines WL, and a source line SL. The memory cell array 110 is formed from a plurality of blocks BLK in which electrically rewritable memory cell transistors (to also simply be referred to as, for example, memory cells) MC are arranged in a matrix. Each memory cell transistor MC includes, for example, a stacked gate including a control gate electrode and a charge accumulation layer (for example, floating gate electrode), and stores binary or multivalued data in accordance with a change in the threshold of the transistor determined by the amount of charges injected into the floating gate electrode. The memory cell transistor MC may have a MONOS (Metal-Oxide-Nitride-Oxide-Silicon) structure that traps electrons in a nitride film.

In a data read operation, write operation, or erase operation, the row control circuits 120*a* and 120*b* select one of the blocks BLK and set the remaining blocks BLK in an unselected state. The row control circuits 120*a* and 120*b* apply a voltage necessary in the read operation, write operation, or erase operation to the word lines WL and select gate lines SGL of the memory cell array 110. Note that the row control circuits 120*a* and 120*b* will simply be referred to as row control circuits 120 if they are not discriminated.

The column control circuit 130 includes sense amplifiers (sense circuits) 131-0 to 131-*n* (n is a natural number) each of which senses and amplifies the voltage of a corresponding bit line BL in the memory cell array 110, and data storage circuits (not shown) configured to latch readout data or data to be written. Note that the sense amplifiers 131-0 to 131-*n* will simply be referred to as sense amplifiers 131 if they are not discriminated. The column control circuit 130 senses data of the memory cell transistors MC in the memory cell array 110 via the bit lines BL.

In addition, the column control circuit 130 outputs the data of the memory cell transistors MC read out to the data storage circuits from the data input/output terminal 150*a* to an external device (host 2) via the input/output buffer 150*b*.

The bit line charging unit 140 includes bit line charging circuits 141-0 to 141-*n* each of which charges a corresponding bit line BL. Each of the bit line charging circuits 141-0 to 141-*n* has a latch circuit structure. When the sense amplifiers 131 charge the bit lines BL from one end side, the bit line charging circuits 141-0 to 141-*n* charge the bit lines BL from the other end side. Note that the bit line charging circuits 141-0 to 141-*n* supply a voltage supplied from the power supply line 160 to the bit lines BL. Note that the bit line charging circuits 141-0 to 141-*n* will simply be referred to as bit line charging circuits 141 if they are not discriminated.

The input/output buffer 150*b* receives data from the data input/output terminal 150*a* and stores it in a data storage circuit selected by the column control circuit 130. The input/output buffer 150*b* also outputs data to an external device via the data input/output terminal 150*a*.

The data input/output terminal 150*a* receives various kinds of commands and addresses for, for example, write, read, erase, and status read in addition to write data.

The control circuit 150*d* controls the memory cell array 110, the row control circuits 120, the column control circuit 130, the bit line charging unit 140, the input/output buffer 150*b*, and the voltage generation circuit 150*e*. The control circuit 150*d* causes the voltage generation circuit 150*e* to boost the power supply voltage as needed and applies the boosted voltage to the row control circuits 120, the column control circuit 130, the bit line charging unit 140, and the input/output buffer 150*b* via the power supply line 160 and the like.

The control circuit 150*d* controls the NAND flash memory 100 in accordance with control signals (for example, command latch enable signal CLE, address latch enable signal ALE, and ready/busy signal RY/BY) input from an external device via the control signal input terminal 150*c* and commands input from the data input/output terminal 150*a* via the input/output buffer 150*b*.

The voltage generation circuit 150*e* generates various kinds of voltages in response to an instruction from the control circuit 150*d* at the time of data program, verify, read, and erase.

Note that the power supply line 160 is arranged so as to supply power to the bit line charging unit 140 and laid out, for example, as shown in FIG. 1.

The configuration of the memory cell array 110 is disclosed in U.S. patent application Ser. No. 12/397,711 filed Mar. 3, 2009 and entitled "SEMICONDUCTOR MEMORY DEVICE HAVING PLURALITY OF TYPES OF MEMORIES INTEGRATED ON ONE CHIP". In addition, the configuration thereof is disclosed in U.S. patent application Ser. No. 13/451,185 filed Apr. 19, 2012 and entitled "SEMICONDUCTOR MEMORY DEVICE INCLUDING STACKD GATE HAVING CHARGE ACCUMULATION LAYER AND CONTROL GATE AND METHOD OF WRITING DATA TO SEMICONDUCTOR MEMORY DEVICE", in U.S. patent application Ser. No. 12/405,626 filed Mar. 17, 2009 and entitled "NONVOLATILE SEMICONDUCTOR MEMORY ELEMENT, NONVOLATILE SEMICONDUCTOR MEMORY, AND METHOD FOR OPERATING NONVOLATILE SEMICONDUCTOR MEMORY ELEMENT", and in U.S. patent application Ser. No. 09/956,986 filed Sep. 21, 2001 and entitled "NONVOLATILE SEMICONDUCTOR MEMORY DEVICE HAVING ELEMENT ISOLATING REGION OF TRENCH TYPE AND METHOD OF MANUFACTURING THE SAME". The entire descriptions of these patent applications are incorporated by reference herein.

<1-2> Overall Arrangement of Bit Line Charging Unit

The arrangement of the bit line charging unit 140 provided in the NAND flash memory 100 according to the embodiment will schematically be explained with reference to FIG. 2.

As shown in FIG. 2, a bit line charging circuit 141-(*m*−1) includes NMOS transistors 141*a*, 141*c*, 141*e*, and 141*f* and PMOS transistors 141*b* and 141*d*. the latch circuit structure includes at least NMOS transistors 141*c* and 141*e*, and PMOS transistors 141*b* and 141*d*.

The NMOS transistor 141*a* has a drain coupled to a node N1, a source coupled to a bit line BLm−1, and a gate configured to receive a signal "CHARGE_EN1".

The PMOS transistor 141*b* has a source coupled to a node N2, a drain coupled to the node N1, and a gate coupled to a node N3. The NMOS transistor 141*c* has a drain coupled to the node N1, a source grounded (GND) via a node N4, and a gate coupled to the node N3. The PMOS transistor 141*d* has a source coupled to the node N2, a drain coupled to the node N3, and a gate coupled to the node N1. The NMOS transistor 141*e* has a drain coupled to the node N3, a source grounded via the node N4, and a gate coupled to the node N1. The NMOS transistor 141*f* has a drain coupled to the node N1, a source coupled to the node N3, and a gate configured to receive a signal "EQ_EN".

The bit line charging circuit 141-(*m*−1) has been described. The remaining bit line charging circuits 141 also have the same arrangement as described above.

The signal "CHARGE_EN1" may be input via a signal line commonly coupled to the NMOS transistors 141*a* of the bit line charging circuits 141.

As shown in FIG. 2, a PMOS transistor 142 has a source coupled to the power supply line 160 and a drain coupled to the node N2. The PMOS transistor 142 electrically couples the node N2 and the power supply line 160 based on a signal "CHARGE_EN2" input to the gate.

For example, at the time of an erase operation, the bit line BL is charged to a high voltage VERA (20 V). When the high voltage VERA is applied to the bit line charging circuit 141, high-withstand voltage transistors capable of withstanding a high voltage are probably used as the transistors of the bit line charging circuit 141. In this embodiment, a high-withstand voltage transistor is used as the NMOS transistor 141*a*. This makes it possible to suppress the flow of a current from the bit line BL to the node N1 after completion of charging of the bit line BL. As a result, no high voltage is applied to the node N1. For this reason, low-withstand voltage transistors can be used as the PMOS transistors 141*b* and 141*d* and the NMOS transistors 141*c*, 141*e*, and 141*f*. As described above, in the bit line charging circuit 141, only the NMOS transistor 141*a* needs to be formed of a high-withstand voltage transistor, and an increase in the circuit area is suppressed. The circuit area of the bit line charging circuit 141 is smaller than that of the sense amplifier 131.

Note that the signals "CHARGE_EN1", "CHARGE_EN2", and "EQ_EN" are generated by, for example, the control circuit 150*d*.

<1-3> Bit Line Charging Operation

The charging operation of the memory cell array 110 of the NAND flash memory 100 according to the embodiment will be described with reference to FIGS. 2 and 3. Note that any operation of charging the bit line BL is applicable as the following charging operation.

[Time T0]

At time T0 before the start of bit line charging, the control circuit 150*d* changes the signal "CHARGE_EN1" to "L (low)" level, the signal "CHARGE_EN2" to "H (high)" level, and the signal "EQ_EN" to "H" level. The PMOS transistor 142 and the NMOS transistor 141*a* are thus turned off. Since the NMOS transistor 141*f* is turned on, the nodes N1 and N3 are set to an equipotential.

[Times T1 and T2]

At time T1 to start bit line charging, the sense amplifier 131 starts charging the bit line BL. The control circuit 150*d* raises the signal "CHARGE_EN1" from "L" level to "H" level, and lowers the signal "EQ_EN" from "H" level to "L" level. The NMOS transistor 141*f* is thus turned off. The NMOS transistor 141*a* is turned on, and the sense amplifier 131 starts charging the node N1 via the bit line BL.

The charging time of the bit line BL is determined by the CR time constant of the bit line BL. For this reason, as shown in FIG. 3, the charging time of the bit line BL changes in accordance with its distance from the sense amplifier 131. More specifically, the charging time is shorter in a region of the bit line BL on the side of the sense amplifier 131 than in a region far from the sense amplifier 131. As shown in FIG. 3, charging of the region of the bit line BL on the side of the sense amplifier 131 is completed at time T2. At this time, however, charging of the region of the bit line BL far from the sense amplifier 131 (the region on the side of the bit line charging circuit 141) is not completed yet.

[Times T3 and T4]

To normally operate the bit line charging circuit 141, the potential of the node N1 needs to be much higher than the potential of the node N3. If the potential of the node N1 is much higher than the potential of the node N3, the PMOS transistor 141*d* is turned off, and the NMOS transistor 141*e* is turned on. The node N3 is thus grounded. As a result, the PMOS transistor 141*b* is turned on, and the NMOS transistor 141*c* is turned off. The nodes N2 and N1 are thus electrically coupled.

At time T3 at which a sufficient difference is assumed to have been generated between the potential of the node N1 and the potential of the node N3 by charging of the node N1, the control circuit 150*d* lowers the signal "CHARGE_EN2" from "H" level to "L" level. The PMOS transistor 142 is thus turned on, and the node N2 and the power supply line 160 are electrically coupled. For example, a voltage VDDSA is supplied to the power supply line 160. The bit line BL is charged via the PMOS transistor 142, the node N2, the PMOS transistor 141*b*, the node N1, and the NMOS transistor.

That is, the region of the bit line BL far from the sense amplifier 131 is charged from the bit line charging circuit 141. The bit line BL, which is conventionally charged from only the sense amplifier 131, is charged from the bit line charging circuit 141 as well. At time T4, charging of the bit line BL is completed. It is therefore possible to charge the bit line BL far from the sense amplifier 131 at a high speed, as shown in FIG. 3.

In the bit line charging circuit 141 coupled to the bit line BL not to be charged, the node N1 is not charged and is set to, for example, 0 V. For this reason, the PMOS transistor 141*b* is turned off, and the NMOS transistor 141*c* is turned on. In addition, the PMOS transistor 141*d* is turned on, and the NMOS transistor 141*e* is turned off. Hence, the bit line charging circuit 141 coupled to the bit line BL not to be charged does not charge the bit line BL.

Note that the time T3 to change the signal "CHARGE_EN2" to "L" level can appropriately be selected as long as it is a timing to enable the above-described operation. This timing may be recorded in a fuse region (not shown) or the memory cell array 110.

<1-4> Functional Effects

According to the above-described embodiment, the sense amplifier 131 is coupled to one end of the bit line BL, and the bit line charging circuit 141 is coupled to the other end of the bit line BL. In the charging operation of the bit line BL, the control circuit 150*d* causes the sense amplifier to charge the bit line BL from one end side and causes the bit line charging circuit to charge it from the other end side. It is therefore possible to charge the bit line BL at a high speed.

Along with an increase in the degree of integration and the capacity of the semiconductor storage device, the wiring width of a bit line shrinks, and the resistance of the bit lines and the capacitance between the bit lines increase. This prolongs the charging time of the bit lines. In particular, the charging time of the bit lines becomes long in a structure for charging the bit lines only from one side.

For example, in a semiconductor storage device according to a comparative example that does not include the above-described bit line charging circuit 141, charging of the bit line BL far from the sense amplifier 131 is completed at time T5 (T4<T5). When the bit line charging circuit 141 described in the above embodiment is used, the bit line BL can be charged from an end on the opposite side of the end coupled to the sense amplifier 131. As a result, the bit line BL can be charged at a high speed in this embodiment as compared to the comparative example, as can be seen from FIG. 3.

As described above, according to the above-described embodiment, the bit line charging circuit different from the sense amplifier is added to one end of each bit line. This can speed up charging of the bit lines and improve the operation performance of the NAND flash memory 100 while suppressing an increase in the circuit area.

For example, in the write operation to the memory cell array 110, the bit line BL that inhibits write needs to be charged to a high voltage as compared to the read operation. Even when charging the bit line BL to a high voltage in the write operation, as described above, the time required to charge the bit line BL can be shortened by charging the bit line using the above-described bit line charging circuit 141.

<2> First Modification

The first modification of the embodiment will be described with reference to FIG. 4.

The plurality of bit line charging circuits 141 included in the NAND flash memory 100 according to the embodiment are coupled to the power supply line 160 via, for example, one PMOS transistor 142. However, the present invention is not limited to this. For example, the PMOS transistor 142 may be provided for every k (k is a natural number) bit line charging circuits 141.

Figure 4:
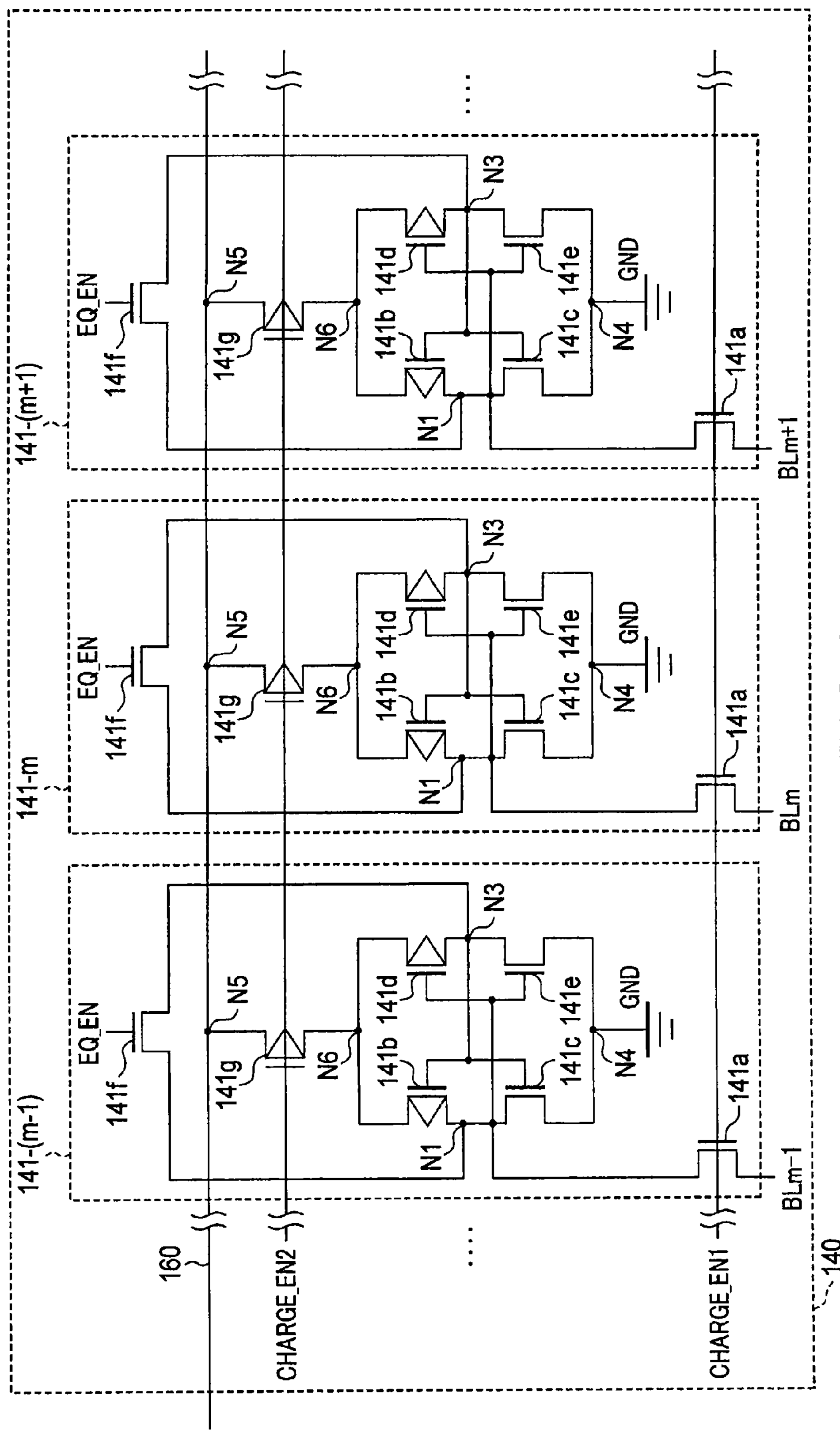
FIG. 4 is a circuit diagram showing the basic arrangement of a bit line charging circuit provided in a NAND flash memory according to the first modification of the embodiment.

Alternatively, a transistor corresponding to the PMOS transistor 142 may be provided for each bit line charging circuit 141, as shown in FIG. 4.

<2-1> Bit Line Charging Circuit

More specifically, as shown in FIG. 4, the bit line charging circuit 141-($m-1$) according to the first modification of the embodiment includes the NMOS transistors 141*a*, 141*c*, 141*e*, and 141*f*, the PMOS transistors 141*b* and 141*d*, and a PMOS transistor 141*g*.

The PMOS transistor 141*g* has a source coupled to a node N5 and a drain coupled to the node N2. The node N5 is coupled to the power supply line 160. The PMOS transistor 141*g* electrically couples a node N6 and the power supply line 160 based on the signal "CHARGE_EN2" input to the gate.

The PMOS transistor 141*b* has a source coupled to the node N6, a drain coupled to the node N1, and a gate coupled to the node N3. The PMOS transistor 141*d* has a source coupled to the node N6, a drain coupled to the node N3, and a gate coupled to the node N1.

The arrangements and operations of the NMOS transistors 141*c*, 141*e*, 141*f*, and 141*a* are the same as described with reference to FIG. 2.

The bit line charging circuit 141-($m-1$) has been described. The remaining bit line charging circuits 141 also have the same arrangement as described above.

The signal "CHARGE_EN2" may be input via a signal line commonly coupled to the PMOS transistors 141*g* of the bit line charging circuits 141.

Note that a bit line charging operation using the bit line charging circuit 141 according to the first modification is the same as the operation described in <1-3>.

<2-2> Functional Effects

For example, in the bit line charging circuit 141 described with reference to FIG. 2, the current sequentially flows from the bit line charging circuit 141 close to the PMOS transistor 142 to the bit line charging circuit 141 far from the PMOS transistor 142. For this reason, the operation timing changes between the bit line charging circuit 141 provided close to the PMOS transistor 142 and that provided far from the PMOS transistor 142.

However, according to the arrangement of the first modification, the transistor for controlling coupling to the power supply line 160 is provided in each bit line charging circuit 141. Hence, in the first modification of the embodiment, the plurality of bit line charging circuits 141 can be coupled to the power supply line 160 almost simultaneously. It is therefore possible to almost simultaneously perform the charging operation of the bit lines BL.

<3> Second Modification

The second modification of the embodiment will be described with reference to FIG. 5.

The NAND flash memory 100 according to the embodiment includes one plane. However, the present invention is not limited to this.

<3-1> Overall Arrangement of NAND Flash Memory

For example, the NAND flash memory 100 may include a plurality of planes, as shown in FIG. 5. The arrangement of the NAND flash memory 100 including two planes will be described with reference to FIG. 5. Note that a structure including the memory cell array 110, the row control circuits 120, the column control circuit 130, and the bit line charging unit 140 will be referred to as a plane here.

As shown in FIG. 5, the NAND flash memory 100 includes two planes, 170*a* and 170*b*.

The peripheral circuit 150 further includes a plane switch 150*f*. The plane switch 150*f* is coupled to the control circuit 150*d* and the voltage generation circuit 150*e*. The plane switch 150*f* switches the output destination (plane 170*a* or 170*b*) of the voltage from the voltage generation circuit 150*e* based on a signal from the control circuit 150*d* or the like.

Note that although the NAND flash memory 100 includes two planes, the present invention is not limited to this, and three or more planes may be provided.

<3-2> Functional Effects

As described above, in the NAND flash memory 100 including a plurality of planes as well, the bit line charging circuit described in the embodiment or first modification is applicable.

<4> Third Modification

In the above-described embodiment, first modification, and second modification, a case where a planar memory is applied as the memory cell array 110 has been described. However, even when a 3D-stacked memory is applied as the memory cell array 110, the same effects as in above-described embodiment, first modification, and second modification can be obtained.

The configuration of the memory cell array 110 is disclosed in U.S. patent application Ser. No. 12/407,403 filed 19 Mar. 2009 and entitled "three dimensional stacked nonvolatile semiconductor memory". In addition, the configuration thereof is disclosed in U.S. patent application Ser. No. 12/406,524 filed 18 Mar. 2009 and entitled "three dimensional stacked nonvolatile semiconductor memory", in U.S. patent application Ser. No. 13/816,799 filed 22 Sep. 2011 and entitled "nonvolatile semiconductor memory device", and in U.S. patent application Ser. No. 12/532,030 filed 23 Mar. 2009 and entitled "semiconductor memory and method for manufacturing the same". All the descriptions of these patent applications are incorporated by reference herein.

In the above-described embodiment, first modification, and second modification, the sense amplifier 131 is provided for each bit line. However, the present invention is not limited to this. A sense amplifier capable of selecting a bit line to be coupled may be used.

In each embodiment of the present invention, (1) in the read operation, the voltage applied to a word line selected in the read operation of A level is, for example, 0 V to 0.55 V. However, the voltage is not limited to this and may be 0.1 V to 0.24 V, 0.21 V to 0.31 V, 0.31 V to 0.4 V, 0.4 V to 0.5 V, or 0.5 V to 0.55 V.

The voltage applied to a word line selected in the read operation of B level is, for example, 1.5 V to 2.3 V. However, the voltage is not limited to this and may be 1.65 V to 1.8 V, 1.8 V to 1.95 V, 1.95 V to 2.1 V, or 2.1 V to 2.3 V.

The voltage applied to a word line selected in the read operation of C level is, for example, 3.0 V to 4.0 V. However, the voltage is not limited to this and may be 3.0 V to 3.2 V, 3.2 V to 3.4 V, 3.4 V to 3.5 V, 3.5 V to 3.6 V, or 3.6 V to 4.0 V.

The time (tR) of the read operation can be, for example, 25 μs to 38 μs, 38 μs to 70 μs, or 70 μs to 80 μs.

(2) The write operation includes a program operation and a verify operation, as described above. In the write operation, the voltage first applied to a word line selected at the time of program operation is, for example, 13.7 V to 14.3 V. However, the voltage is not limited to this and may be, for example, 13.7 V to 14.0 V or 14.0 V to 14.6 V.

The voltage first applied to a selected word line when writing to an odd-numbered word line and the voltage first applied to a selected word line when writing to an even-numbered word line may be different.

When the program operation is performed by the ISPP method (Incremental Step Pulse Program), the step-up voltage is, for example, 0.5 V.

The voltage applied to a non-selected word line can be, for example, 6.0 V to 7.3 V. However, the voltage is not limited to this and may be, for example, 7.3 V to 8.4 V, or 6.0 V or less.

The pass voltage to be applied may be changed depending on whether the non-selected word line is an odd-numbered word line or an even-numbered word line.

The time (tProg) of the write operation can be, for example, 1700 μs to 1800 μs, 1800 μs to 1900 μs, or 1900 μs to 2000 μs.

(3) In the erase operation, the voltage first applied to a well formed in the upper portion of a semiconductor substrate and having a memory cell arranged above is, for example, 12 V to 13.6 V. However, the voltage is not limited to this and may be, for example, 13.6 V to 14.8 V, 14.8 V to 19.0 V, 19.0 V to 19.8 V, 19.8 V to 21 V.

The time (tErase) of the erase operation can be, for example, 3000 μs to 4000 μs, 4000 μs to 5000 μs, or 4000 μs to 9000 μs.

(4) A memory cell includes a charge accumulation layer arranged on a 4 to 10 nm thick tunnel insulating film on a semiconductor substrate (silicon substrate). The charge accumulation layer can have a stacked structure including a 2 to 3 nm thick insulating film made of SiN, SiON, or the like and a 3 to 8 nm thick polysilicon film. A metal such as Ru may be added to polysilicon. An insulating film is formed on the charge accumulation layer. This insulating film includes, for example, a 4 to 10 nm thick silicon oxide film sandwiched between a 3 to 10 nm thick lower high-k film and a 3 to 10 nm thick upper high-k film. The high-k films are made of, for example, HfO. The silicon oxide film can be thicker than the high-k films. A 30 to 70 nm thick control electrode is formed on a 3 to 10 nm thick material on the insulating film. A material used to adjust the work function is a metal oxide film such as TaO or a metal nitride film such as TaN. W or the like can be used for the control electrode.

An air gap can be formed between the memory cells.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor storage device comprising:

a memory cell array including a first memory cell and a second memory cell;

a first bit line coupled to the first memory cell;

a second bit line coupled to the second memory cell;

a sense circuit coupled to the first bit line and being capable of charging the first bit line independent of the second bit line; and a charging circuit, the memory cell array being disposed between the sense circuit and the charging circuit and being capable of charging the first bit line independent of the second bit line, wherein the charging circuit comprises:

a first transistor including a first terminal coupled to the first bit line and a second terminal coupled to a first node;

a second transistor including a first terminal coupled to the first node, a second terminal coupled to a second node, and a gate coupled to a third node;

a third transistor including a first terminal coupled to the first node, a second terminal coupled to a fourth node, and a gate coupled to the third node;

a fourth transistor including a first terminal coupled to the third node, a second terminal coupled to the second node, and a gate coupled to the first node; and a fifth transistor including a first terminal coupled to the third node, a second terminal coupled to the fourth node, and a gate coupled to the first node, and a bit line charging current is input to the second node, and a ground potential is input to the fourth node.

2. The semiconductor storage device of claim 1, wherein the sense circuit starts a charging operation of the first bit line at first timing, and the charging circuit starts the charging operation of the first bit line at second timing after the first timing.

3. The semiconductor storage device of claim 1, further comprising a sixth transistor including a first terminal coupled to a power supply line and a second terminal coupled to the second node.

4. The semiconductor storage device of claim 3, wherein the charging circuit further comprises a seventh transistor including a first terminal coupled to the first node and a second terminal coupled to the third node.

5. The semiconductor storage device of claim 3, wherein the first, third, and fifth transistors are of a first conductivity type, the second, fourth, and sixth transistors are of a second conductivity type different from the first conductivity type.

6. The semiconductor storage device of claim 1, wherein the charging circuit further comprises a sixth transistor including a first terminal coupled to a power supply line and a second terminal coupled to the second node.

7. The semiconductor storage device of claim 6, wherein the charging circuit further comprises a seventh transistor including a first terminal coupled to the first node and a second terminal coupled to the third node.

8. The semiconductor storage device of claim 6, wherein the first, third, and fifth transistors are of a first conductivity type, the second, fourth, and sixth transistors are of a second conductivity type different from the first conductivity type.

9. The semiconductor storage device of claim 1, wherein the charging circuit further comprises a seventh transistor including a first terminal coupled to the first node and a second terminal coupled to the third node.

10. The semiconductor storage device of claim 9, further comprising a control circuit capable of turning off the first transistor and the sixth transistor and capable of turning on the seventh transistor before the sense circuit starts the charging operation of the first bit line, and when the sense circuit starts the charging operation of the first bit line, capable of turning off the seventh transistor, capable of turning on the first transistor, and after a first period, capable of turning on the sixth transistor, thereby capable of charging the first bit line.

11. The semiconductor storage device of claim 1, wherein the first, third, and fifth transistors are of a first conductivity type, the second, and fourth transistors are of a second conductivity type different from the first conductivity type.

12. The semiconductor storage device of claim 1, wherein the charging circuit has a latch circuit structure.

13. The semiconductor storage device of claim 1, wherein the charging circuit is coupled to the first bit line.

* * * * *